(12) United States Patent
Ahmed et al.

(10) Patent No.: US 6,967,175 B1
(45) Date of Patent: Nov. 22, 2005

(54) DAMASCENE GATE SEMICONDUCTOR PROCESSING WITH LOCAL THINNING OF CHANNEL REGION

(75) Inventors: Shibly S. Ahmed, San Jose, CA (US); Haihong Wang, Milpitas, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 27 days.

(21) Appl. No.: 10/726,619

(22) Filed: Dec. 4, 2003

(51) Int. Cl.[7] .................... H01L 21/302; H01L 21/461
(52) U.S. Cl. .................. 438/753; 438/933; 438/752
(58) Field of Search .................. 438/755, 197, 438/311, 680, 681, 683, 692, 723, 724, 706, 438/745, 756, 575, 738, 742, 722, 752, 933

(56) References Cited

U.S. PATENT DOCUMENTS

| | | | |
|---|---|---|---|
| 6,225,173 B1 | 5/2001 | Yu ........................ | 438/301 |
| 6,413,802 B1 | 7/2002 | Hu et al. ................ | 438/151 |
| 6,472,258 B1 | 10/2002 | Adkisson et al. ....... | 438/192 |
| 6,475,869 B1 | 11/2002 | Yu ........................ | 438/303 |
| 6,475,890 B1 * | 11/2002 | Yu ........................ | 438/574 |
| 6,583,469 B1 * | 6/2003 | Fried et al. ............ | 257/329 |
| 6,642,090 B1 * | 11/2003 | Fried et al. ............ | 438/164 |
| 6,787,854 B1 * | 9/2004 | Yang et al. ............ | 257/348 |
| 6,855,989 B1 | 2/2005 | Wang et al. ........... | 257/349 |
| 2002/0093053 A1 | 7/2002 | Chan et al. ............ | 257/347 |
| 2002/0130354 A1 | 9/2002 | Sekigawa et al. ...... | 257/315 |
| 2002/0153587 A1 | 10/2002 | Adkisson et al. ...... | 257/510 |
| 2002/0177263 A1 | 11/2002 | Hanafi et al. .......... | 438/183 |

FOREIGN PATENT DOCUMENTS

| | | |
|---|---|---|
| WO | WO 04/068589 | 8/2004 |
| WO | WO 04/093181 | 10/2004 |

OTHER PUBLICATIONS

Co-pending U.S. Appl. No. 10/405,342, filed Apr. 3, 2003 entitled: "Method for Forming a Gate in a FinFet Device and Thinning a Fin in a Channel Region of the FinFet Device," 17 pages specification; 14 sheet of drawings.

Digh Hisamoto et al.: "FinFET—Self-Aligned Double-Gate MOSFET Scalable to 20 nm," IEEE Transactions on Electron Devices, vol. 47, No. 12, Dec. 2000, pp. 2320-2325.

Yang-Kyu Choi et al.: "Sub-20nm CMOS Fin FET Technologies," 2001 IEEE, IEDM, pp. 421-424.

Xuejue Huang et al.: "Sub-50 nm P-Channel Fin FET," IEEE Transactions on Electron Devices, vol. 48, No. 5, May 2001, pp. 880-886.

Yamg-Kyu Choi et al.: "Nanoscale CMOS Spacer FinFET for the Terabit Era," IEEE Electron Device Letters, vol. 23, No. 1, Jan. 2002, pp. 25-27.

Xuejue Huang et al.: "Sub 50-nm FinFET: PMOS," 1999 IEEE, IEDM, pp. 67-70.

Co-pending U.S. Appl. No. 10/754,540, filed Jan. 12, 2004; entitled: "Narrow-Body Damascene Tri-Gate FinFET," 13 page specification, 13 sheets of drawings.

* cited by examiner

*Primary Examiner*—David Nhu
(74) *Attorney, Agent, or Firm*—Harrity & Snyder, LLP

(57) ABSTRACT

A method of manufacturing a semiconductor device may include forming a fin on an insulator and forming a gate oxide on sides of the fin. The method may also include forming a gate structure over the fin and the gate oxide and forming a dielectric layer adjacent the gate structure. Material in the gate structure may be removed to define a gate recess. A width of a portion of the fin below the gate recess may be reduced, and a metal gate may be formed in the gate recess.

20 Claims, 12 Drawing Sheets

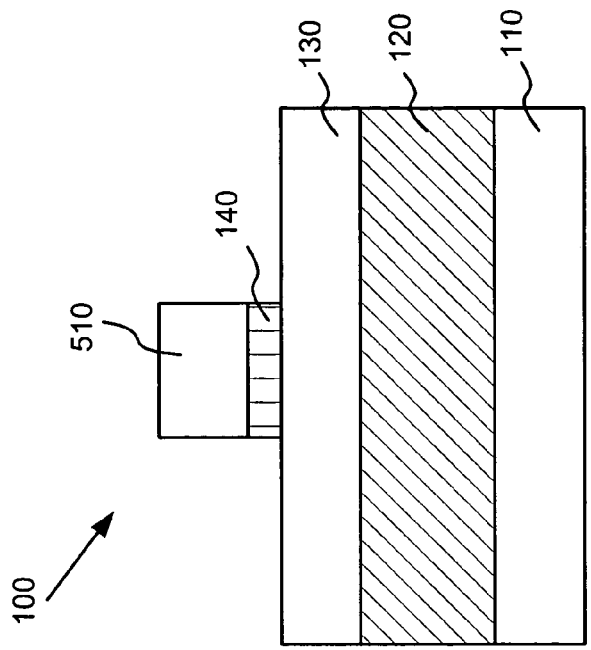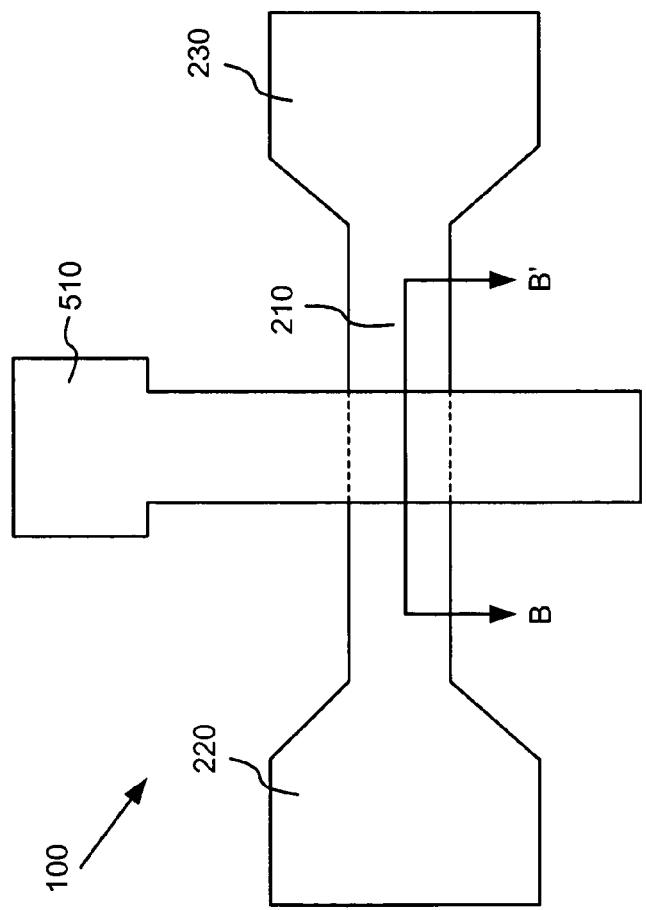
Fig. 5B
Fig. 5A

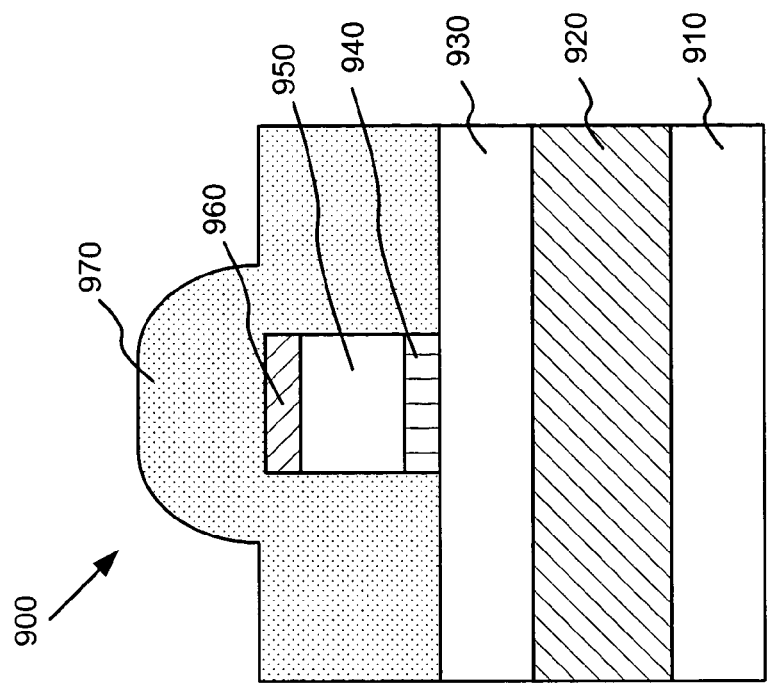
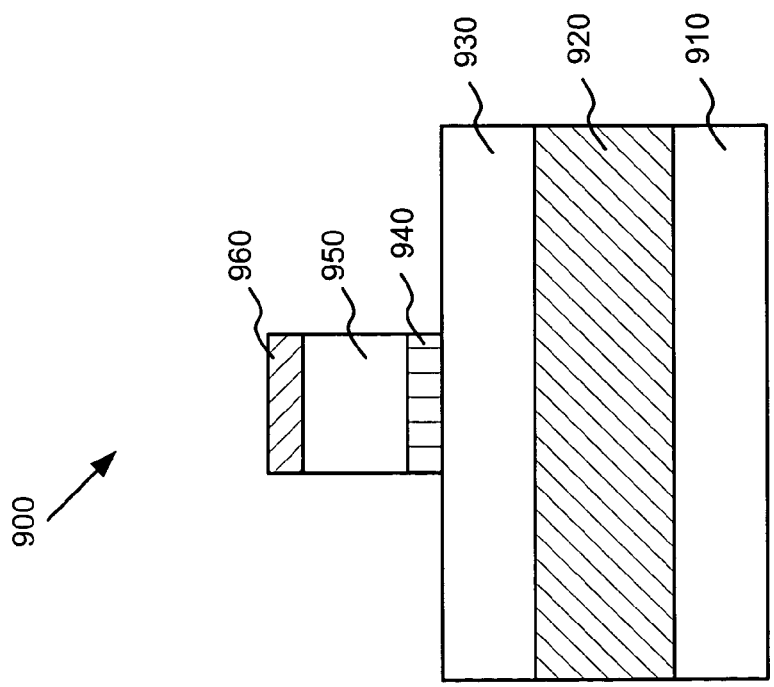

DAMASCENE GATE SEMICONDUCTOR PROCESSING WITH LOCAL THINNING OF CHANNEL REGION

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In several respects, the double-gate MOSFETs offer better characteristics than the conventional bulk silicon MOSFETs. These improvements arise because the double-gate MOSFET has a gate electrode on both sides of the channel, rather than on only one side as in conventional MOSFETs. When there are two gates, the electric field generated by the drain is better screened from the source end of the channel. Also, two gates can control roughly twice as much current as a single gate, resulting in a stronger switching signal.

A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide a method of forming a FinFET device that includes a metal gate using a damascene process. The thickness of a fin in a channel region may be reduced after removal of a dummy gate.

Additional advantages and other features of the invention will be set forth in part in the description which follows and in part will become apparent to those having ordinary skill in the art upon examination of the following or may be learned from practice of the invention. The advantages and features of the invention may be realized and obtained as particularly pointed out in the appended claims.

According to the present invention, the foregoing and other advantages are achieved in part by a method of manufacturing a semiconductor device that includes forming a fin structure on an insulator and forming a gate structure over a portion of the fin structure. The method may also include forming a dielectric layer adjacent the gate structure and removing material in the gate structure. A width of a portion of the fin structure may be reduced. A metal may be deposited to replace the removed material in the gate structure.

According to another aspect of the invention, a method of manufacturing a semiconductor device may include forming a fin on an insulator and forming a gate oxide on sides of the fin. The method may also include forming a gate structure over the fin and the gate oxide and forming a dielectric layer adjacent the gate structure. Material in the gate structure may be removed to define a gate recess. A width of a portion of the fin below the gate recess may be reduced, and a metal gate may be formed in the gate recess.

According to a further aspect of the invention, a method of manufacturing a semiconductor device may include forming a fin on an insulator and forming a dielectric cap over the fin. The method may also include forming gate oxide layers on opposite sides of the fin and forming a gate structure over the fin and dielectric cap. The method may further include forming a dielectric layer adjacent the gate structure and removing the gate structure to define a gate recess within the dielectric layer and to expose the dielectric cap and gate oxide layers. The gate oxide layers from the opposite sides of the fin may be removed, and a width of the fin below the gate recess may be reduced. A metal gate may be formed in the gate recess.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, where elements having the same reference number designation may represent like elements throughout.

FIG. 5A schematically illustrates a top view of a FinFET structure in accordance with an exemplary embodiment of the present invention.

FIG. 5B is a cross-section illustrating the formation of the FinFET structure of FIG. 5A in accordance with an exemplary embodiment of the present invention.

FIGS. 9A, 9B, and 9C are cross-sections illustrating the formation and polishing of a semiconductor device in accordance with another implementation of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide a method of forming a FinFET device that may include a metal gate formed using a damascene process. After removing a dummy gate, but before forming the metal gate, the thickness of a silicon fin may be reduced.

Figure 1:
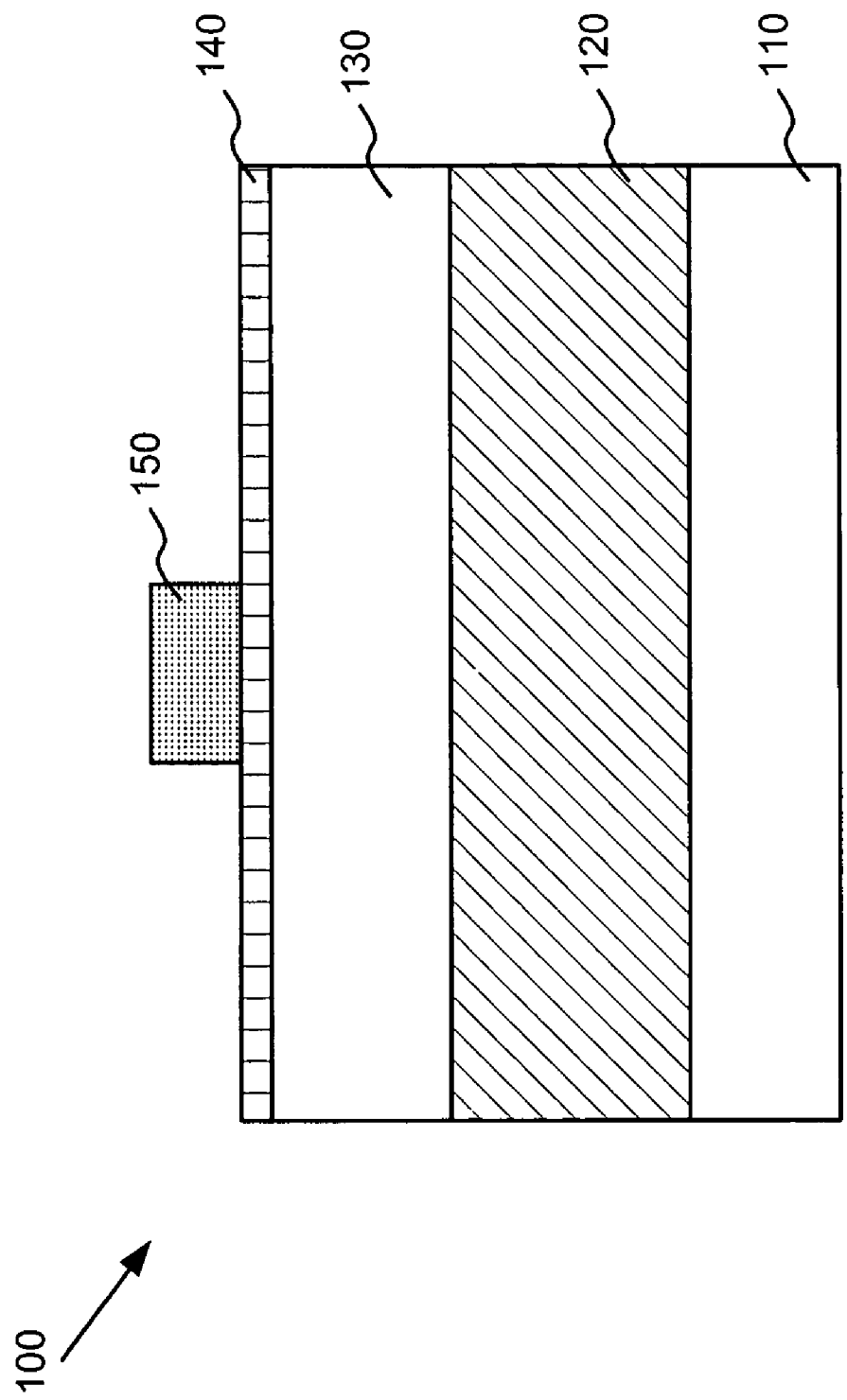
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 formed on the buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1000 Å to about 3000 Å. Silicon layer 130 may include monocrystalline or polycrystalline silicon having a thickness ranging from about 300 Å to about 1500 Å. Silicon layer 130 is used to form a fin structure for a double-gate transistor device, as described in more detail below.

In alternative implementations consistent with the present invention, substrate 110 and layer 130 may include other semiconducting materials, such as germanium, or combinations of semiconducting materials, such as silicon-germanium. Buried oxide layer 120 may also include other dielectric materials.

A top dielectric layer 140, such as a silicon nitride layer or a silicon oxide layer (e.g., $SiO_2$), may be formed over silicon layer 130 to act as a protective cap during subsequent etching processes. In an exemplary implementation, dielectric layer 140 may be formed to a thickness ranging from about 150 Å to about 700 Å. Next, a photoresist material may be deposited and patterned to form a photoresist mask 150 for subsequent processing. The photoresist may be deposited and patterned in any conventional manner.

Semiconductor device 100 may then be etched. In an exemplary implementation, dielectric layer 140 and silicon layer 130 may be etched in a conventional manner, with the etching terminating on buried oxide layer 120 to form a fin. Photoresist mask 150 may then be removed. After the formation of the fin, source and drain regions may be formed (e.g., by deposition or epitaxial growth of a semiconducting material) adjacent the respective ends of the fin. For example, in an exemplary embodiment, a layer of silicon, germanium or combination of silicon and germanium may be deposited, patterned and etched in a conventional manner to form source and drain regions. Alternately, the source and drain regions may be formed in the same photolithography process that forms the fin.

Figure 2A:
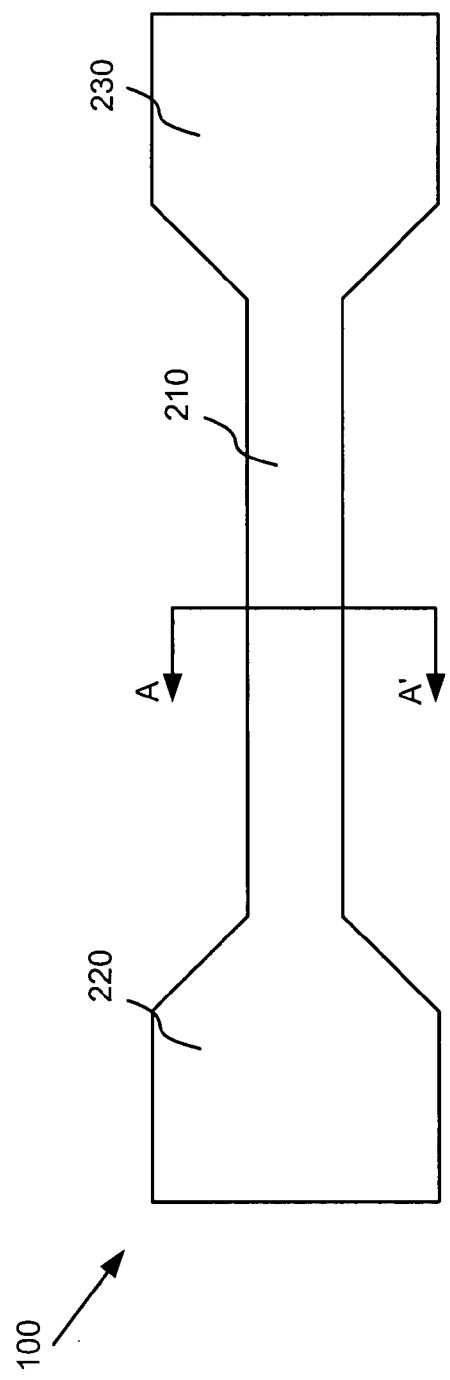
FIG. 2A schematically illustrates the top view of a fin structure in accordance with an exemplary embodiment of the present invention.

FIG. 2A schematically illustrates the top view of a fin structure on semiconductor 100 formed in such a manner. Source region 220 and drain region 230 may be formed adjacent the ends of fin 210 on buried oxide layer 120, according to an exemplary embodiment of the present invention.

Figure 2B:
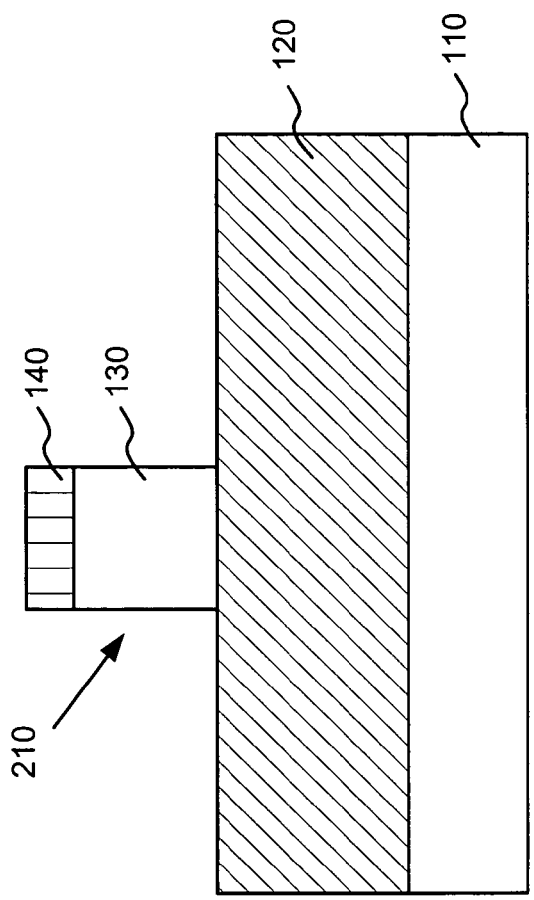
FIG. 2B is a cross-section illustrating the formation of the fin structure of FIG. 2A in accordance with an exemplary embodiment of the present invention.

FIG. 2B is a cross-section along line A–A' in FIG. 2A illustrating the formation of fin structure 210 in accordance with an exemplary embodiment of the present invention. As described above, dielectric layer 140 and silicon layer 130 may be etched to form structure 210. Structure 210 may include a silicon fin 130 and dielectric cap 140.

Figure 3:
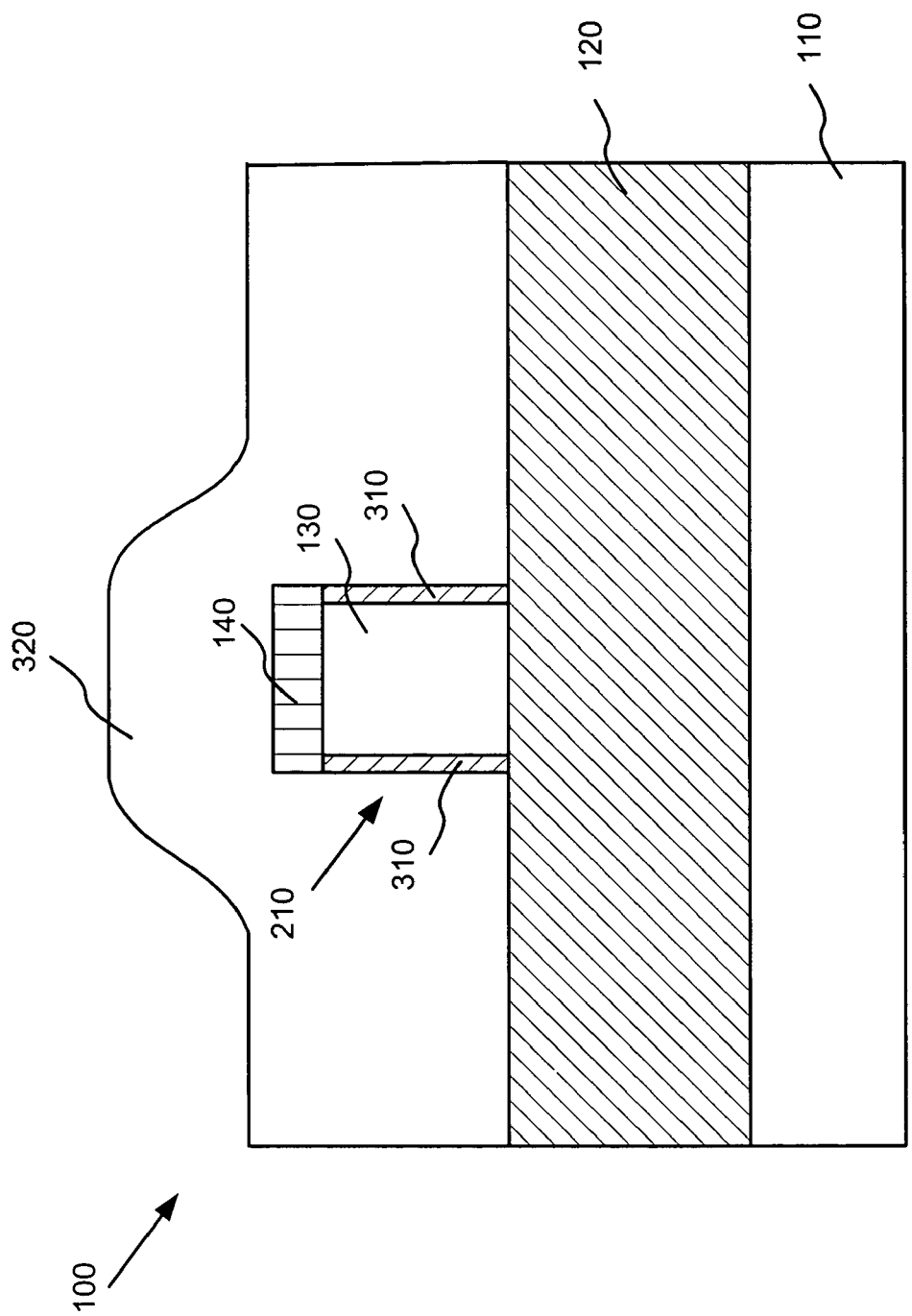
FIG. 3 is a cross-section illustrating the formation of a gate oxide and gate material on the device of FIG. 2B in accordance with an exemplary embodiment of the present invention.

FIG. 3 is a cross-section illustrating the formation of a gate oxide and gate material on fin structure 210 in accordance with an exemplary embodiment of the present invention. A relatively thin gate oxide may be formed on exposed side surfaces of fin 130 as illustrated in FIG. 3. For example, a gate oxide 310 may be thermally grown on fin 130. The gate oxide 310 may be grown to a thickness of about 50 Å to about 150 Å and may be formed on the side surfaces of the silicon fin 130.

A gate material layer 320 may be deposited over semiconductor device 100 after formation of the gate oxide 310. In an exemplary implementation, the gate material layer 320 may include polysilicon deposited using conventional chemical vapor deposition (CVD) or other well known techniques. Alternatively, other semiconducting materials, such as germanium or combinations of silicon and germanium, or various metals may be used as the gate material in layer 320.

Figure 4:
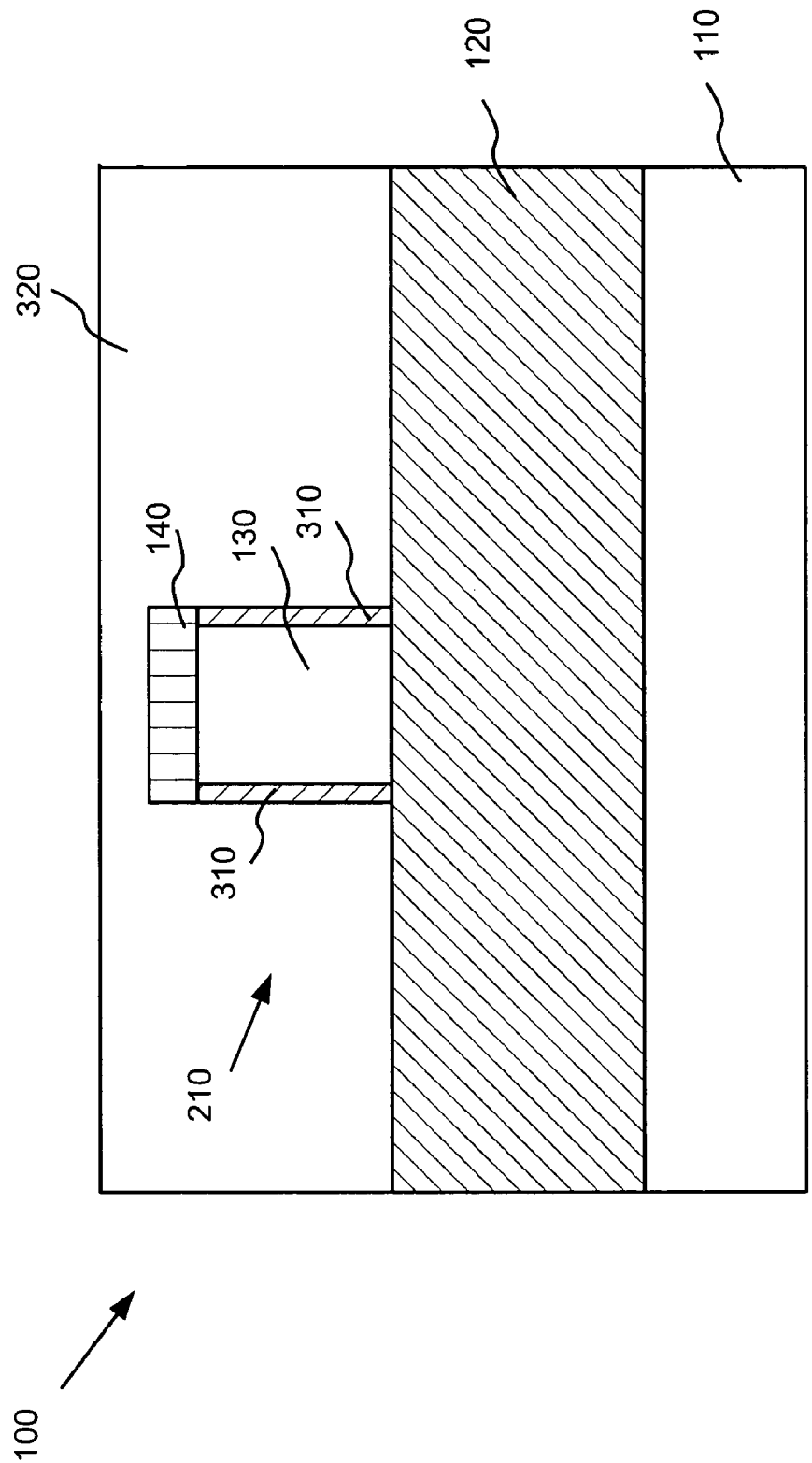
FIG. 4 is a cross-section illustrating the planarizing of the gate material of FIG. 3 in accordance with an exemplary embodiment of the present invention.

FIG. 4 is a cross-section illustrating the planarizing of the gate material 320 in accordance with an exemplary embodiment of the present invention. Planarizing the gate material 320 may remove any non-planar protrusions in the material, such as that shown above the fin structure 210 in FIG. 3. Returning to FIG. 4, chemical-mechanical polishing (CMP) or other conventional techniques may be performed so that the upper surface of gate material 320 is substantially planar. As shown in FIG. 4, the planar gate material 320 may extend about 200 to about 700 Å above the dielectric cap 140. A thickness of the gate material 320 in the areas adjacent fin structure 210 after planarizing may range from about 700 Å to about 2000 Å.

FIG. 5A schematically illustrates the top view of semiconductor device 100 at one stage in processing in accordance with an exemplary embodiment of the present invention. As illustrated, a gate may be patterned and etched in gate material 320 to form gate structure 510 that extends across a channel region of the fin structure 210.

FIG. 5B is a cross-section taken along line B–B' in FIG. 5A and illustrates the formation of semiconductor device 100 of FIG. 5A in accordance with an exemplary embodiment of the present invention. Gate structure 510 may be defined in the gate material layer 320 by lithography (e.g., photolithography). A bottom antireflective coating (BARC) layer (not shown) may be deposited on the planar gate material layer 320 to facilitate etching of gate material layer 320. As will be understood by those skilled in the semiconductor art, photoresist (and possibly a top antireflective (TAR) coating) may be deposited on the BARC layer and patterned in the shape of gate structure 510.

Gate material layer 320 may then be selectively etched to form the gate structure 510 out of the gate material layer 320 on device 100. The planar gate material layer 320 may provide at least a planar bottom surface for the BARC layer (not shown), and may tend to flatten the top surface of the BARC layer. The BARC layer may have a thickness ranging from about 100 Å to about 500 Å. Because of the planar gate material layer 320, the photoresist over the BARC layer may be patterned more precisely. As a result, the gate structure 510's critical dimension (CD) (i.e., its smallest feature size such as the gate width) may be formed with dimensions as small as from about 20 nm to about 50 nm.

Gate structure 510 may include a gate portion proximate to the sides of the fin structure 210 and a larger electrode portion spaced apart from the fin structure 210. The electrode portion of gate structure 510 may provide an accessible electrical contact for biasing or otherwise controlling the gate portion.

As may be seen in FIG. 5B, dielectric cap 140 located outside the perimeter of the gate structure 510 may be removed. In other words, the selective etching of gate material layer 320 may remove all material beyond the gate structure 510, down to the silicon fin 130 of fin structure 210. Further, it should be noted that the gate oxide 310 is still present on silicon fin 130, but is not illustrated in FIG. 5B because the line B–B' in FIG. 5A extends along the silicon fin 130 of fin structure 210.

The source/drain regions 220 and 230 may then be doped. For example, n-type or p-type impurities may be implanted in source/drain regions 220 and 230. The particular implantation dosages and energies may be selected based on the particular end device requirements. One of ordinary skill in this art would be able to optimize the source/drain implantation process based on the circuit requirements and such acts are not disclosed herein in order not to unduly obscure the thrust of the present invention. In addition, sidewall spacers (not shown) may optionally be formed prior to the source/drain ion implantation to control the location of the source/drain junctions based on the particular circuit requirements. Activation annealing may then be performed to activate the source/drain regions 220 and 230.

Figure 6A:
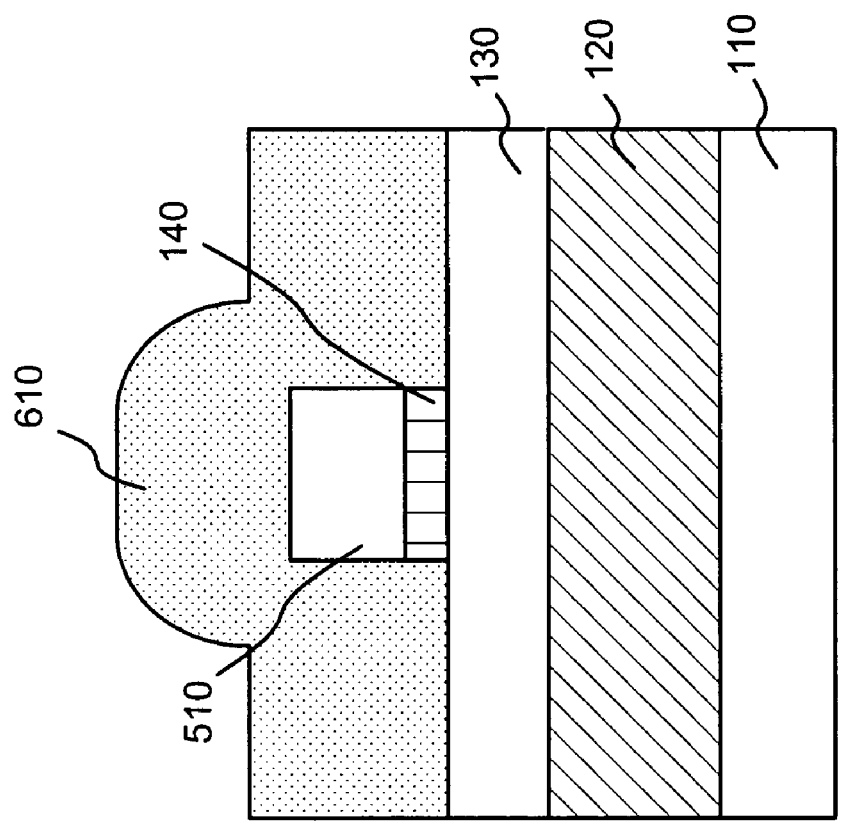
FIG. 6A is a cross-section illustrating the formation of a surrounding oxide layer on the FinFET structure of FIG. 5B in accordance with an exemplary embodiment of the present invention.

FIG. 6A is a cross-section illustrating the formation of a surrounding oxide layer 610 on semiconductor device 100 of FIG. 5B in accordance with an exemplary embodiment of the present invention. As illustrated, surrounding oxide layer 610 may be deposited over fin structure 210 (including silicon fin 130) and adjacent gate structure 510. In one implementation consistent with the principles of the invention, surrounding oxide layer 610 may include a protective compound such as tetraethyl orthosilicate (TEOS), although any other dielectric material may be used.

Figure 6C:
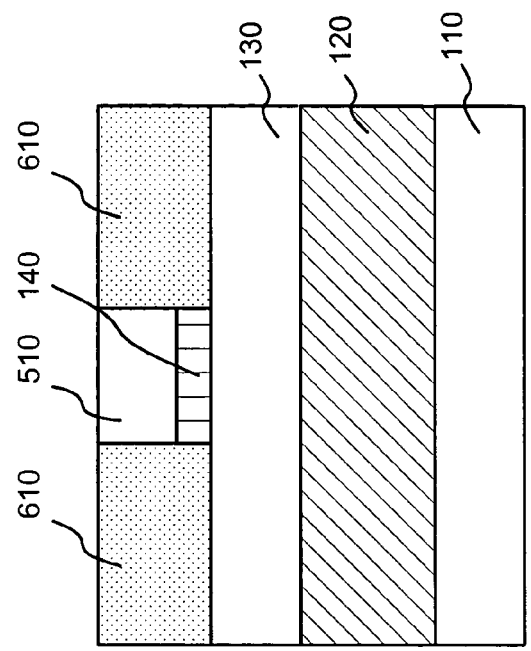
FIG. 6C is a cross-section illustrating the formation of the planarized structure of FIG. 6B in accordance with an exemplary embodiment of the present invention.
Figure 6B:
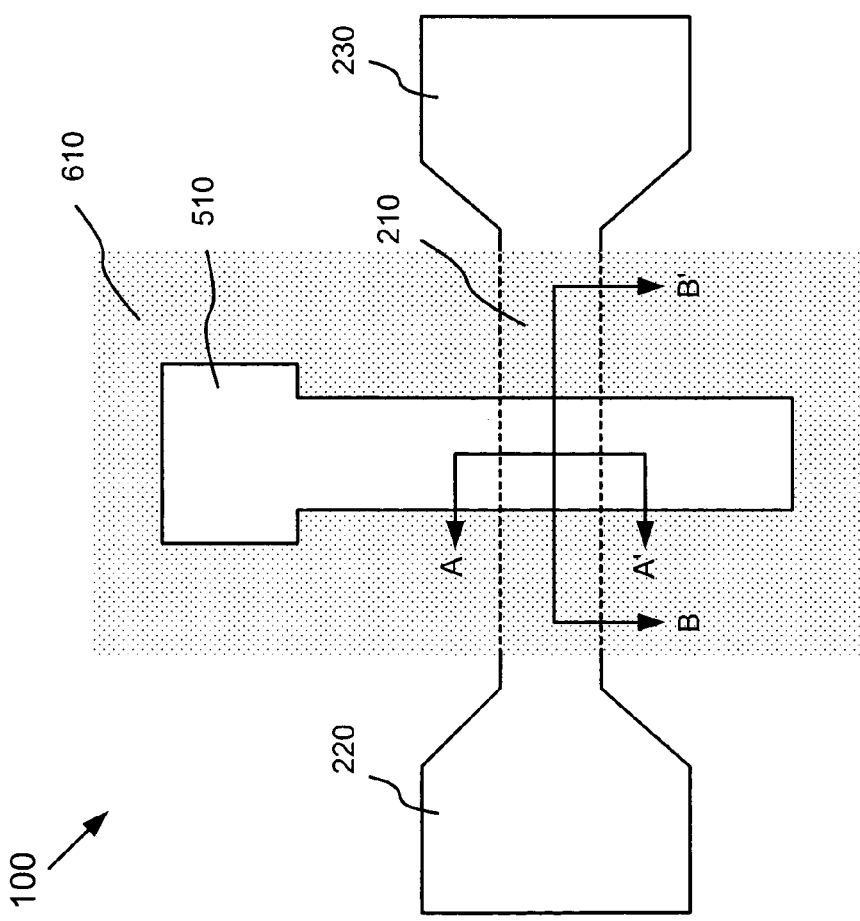
FIG. 6B schematically illustrates a top view of a planarized structure in accordance with an exemplary embodiment of the present invention.

FIG. 6B schematically illustrates a top view of a planarized semiconductor device 100 in accordance with an exemplary embodiment of the present invention. As shown, surrounding oxide layer 610 may be removed from over gate structure 510, for example, by a polishing process. Surrounding oxide layer 610, however, may still enclose the perimeter of gate structure 510. Although not illustrated in FIG. 6B, surrounding oxide layer 610 also may extend over source/drain regions 220 and 230 in some implementations.

FIG. 6C is a cross-section along line B–B' in FIG. 6B illustrating the formation of planarized semiconductor device 100 in accordance with an exemplary embodiment of the present invention. As shown, surrounding oxide layer 610 may be polished back (e.g., by CMP) to expose gate structure 510 and to be coplanar with the top of gate structure 510. As illustrated in FIG. 6C, surrounding oxide layer 610 may extend above the entire silicon fin 130 except for the portion of silicon fin 130 that is covered by the dielectric cap 140 and gate structure 510.

Figure 7B:
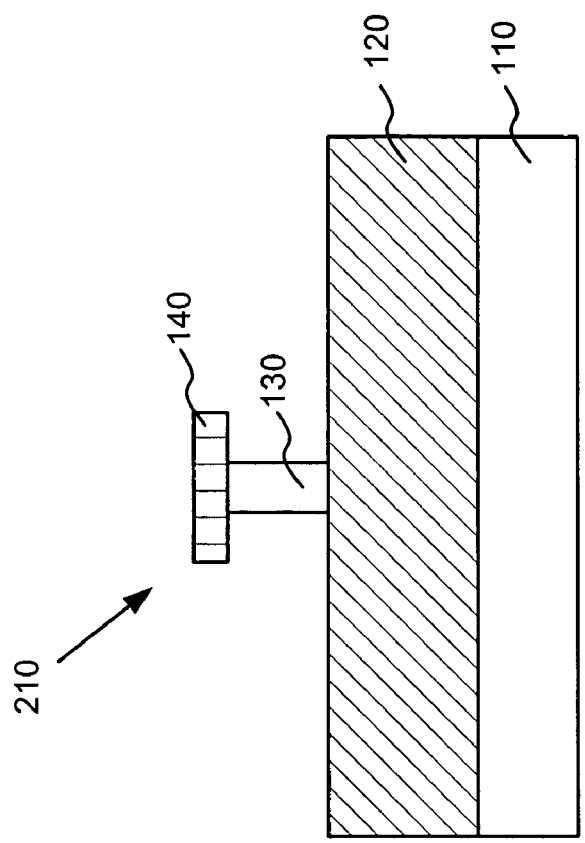
FIG. 7B is another cross-section illustrating a further stage in the formation of the FinFET structure in accordance with an exemplary embodiment of the present invention.
Figure 7A:
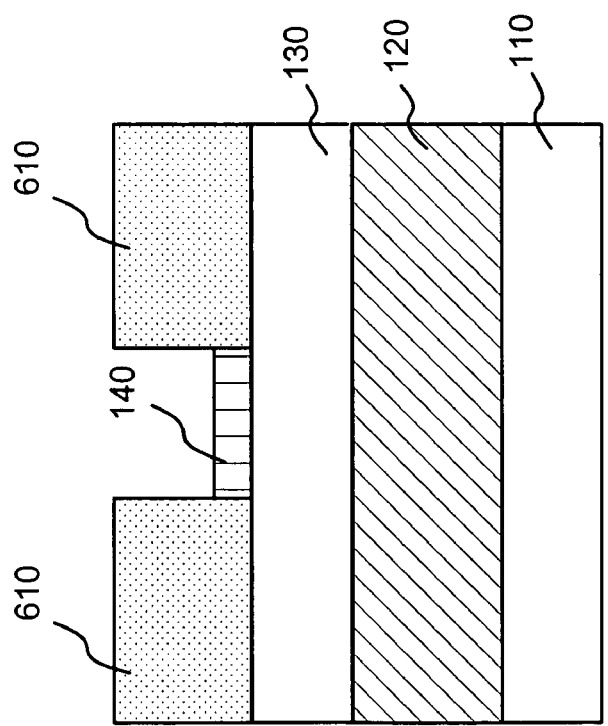
FIG. 7A is a cross-section illustrating a further stage in the formation of the FinFET structure in accordance with an exemplary embodiment of the present invention.

FIG. 7A is a cross-section along line B–B' in FIG. 6B illustrating a further stage in the formation of the semiconductor device 100 in accordance with an exemplary embodiment of the present invention. As shown, gate structure 510 (e.g., polysilicon) may be removed by, for example, selective etching. Because gate structure 510 is intended to be removed during processing, it may be referred to as a "dummy gate." Dielectric cap 140 under the gate structure 510 may protect the top of silicon fin 130 from being etched away during the removal of gate structure 510. Oxide layer 610 may act as a mask to protect other portions of semiconductor device 100 during the etching.

FIG. 7B is a cross-section along line A–A' in FIG. 6B illustrating a further stage in the formation of semiconductor device 100 in accordance with an exemplary embodiment of the present invention. Concurrent with (or after) removal of gate structure 510, gate oxide 310 on the sides of the silicon fin 130 may also be completely removed. The width of silicon fin 130 may then be selectively thinned in the channel region (e.g., relative to its original width from lithographic formation, which is illustrated by the width of dielectric cap 140), as shown in FIG. 7B. Such selective thinning may be accomplished, for example, by wet etching, and may decrease the width of silicon fin 130 in the channel region (i.e., formerly under gate structure 510 before its removal). Portions of silicon fin 130 not in the channel region are covered and protected by surrounding oxide layer 610 during such thinning.

In some implementations, it may be desirable for the width of silicon fin 130 to be less than a length of the gate. As an example, for good short channel control, it may be desirable for the width of silicon fin 130 to be less than half of the gate's length (i.e., <gate length/2). Onerous demands may be placed on lithography process parameters (i.e., greatly increasing processing difficulty) if such a small width of silicon fin 130 were to be achieved solely by lithography (e.g., in FIG. 2A). If silicon fin 130 is initially, lithographically defined to be the same size or larger than gate structure 510 and then is thinned after removing the "dummy gate" 510 in the above damascene gate process, however, a silicon fin 130 that is significantly smaller than the gate may be achieved. Such local thinning of silicon fin 130 as illustrated in FIG. 7B may achieve a fin of a desired width more easily than by lithography alone (e.g., FIG. 2A).

Because the thinning of silicon fin 130 may be performed by wet etching, the sidewall surfaces of thinned silicon fin 130 may be smoother than by lithography alone. Such smoother sidewall surfaces of thinned silicon fin 130 may improve the carrier mobility of the vertically-oriented channels of semiconductor device 100. The widths of silicon fin 130 before and after thinning may depend on the length of dummy gate 510 in the channel region. As one example, however, the width of silicon fin 130 may be in a range of about 40–100 nm before thinning and may be in a range of about 10–50 nm after thinning. In another implementation consistent with the principles of the invention, the thinning may reduce the total width of silicon fin 130 by about 30 nm to about 80 nm.

As shown in FIGS. 7A and 7B, at least some of dielectric cap 140 may remain after removing gate structure 510 and thinning silicon fin 130. In one implementation consistent with the principles of the invention, dielectric cap 140 may be left in place to insulate the top of thinned silicon fin 130 from subsequently-deposited gate material (e.g., a metal). In another implementation consistent with the principles of the invention (described further below), dielectric cap 140 may be removed (e.g., by etching) so that thinned silicon fin 130 in the channel region of semiconductor device 100 is exposed for subsequent processing.

Figure 8B:
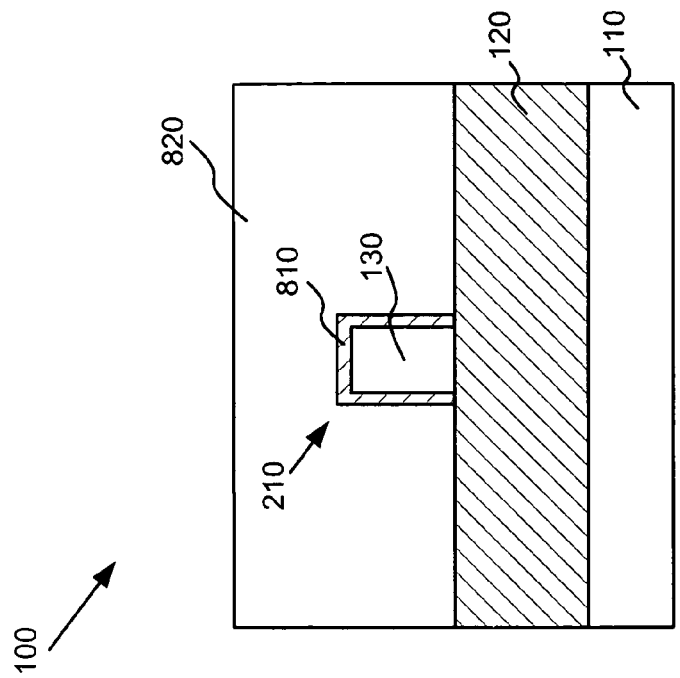
FIGS. 8B and 8C are cross-sections further illustrating the formation of the FinFET structure in accordance with an exemplary embodiment of the present invention.
Figure 8A:
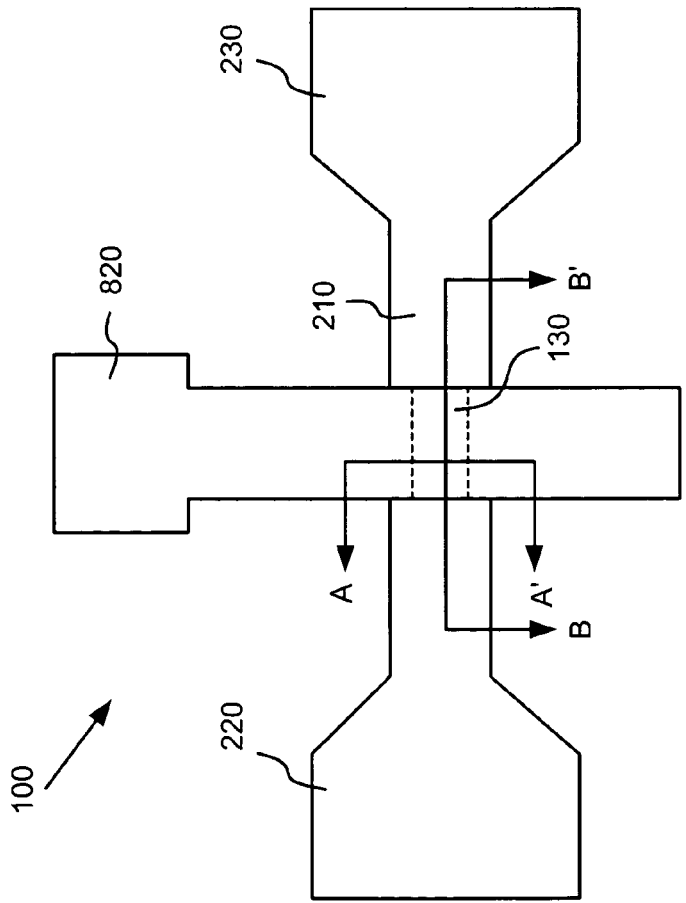
FIG. 8A schematically illustrates the top view of the FinFET structure in accordance with an exemplary embodiment of the present invention.
Figure 8C:
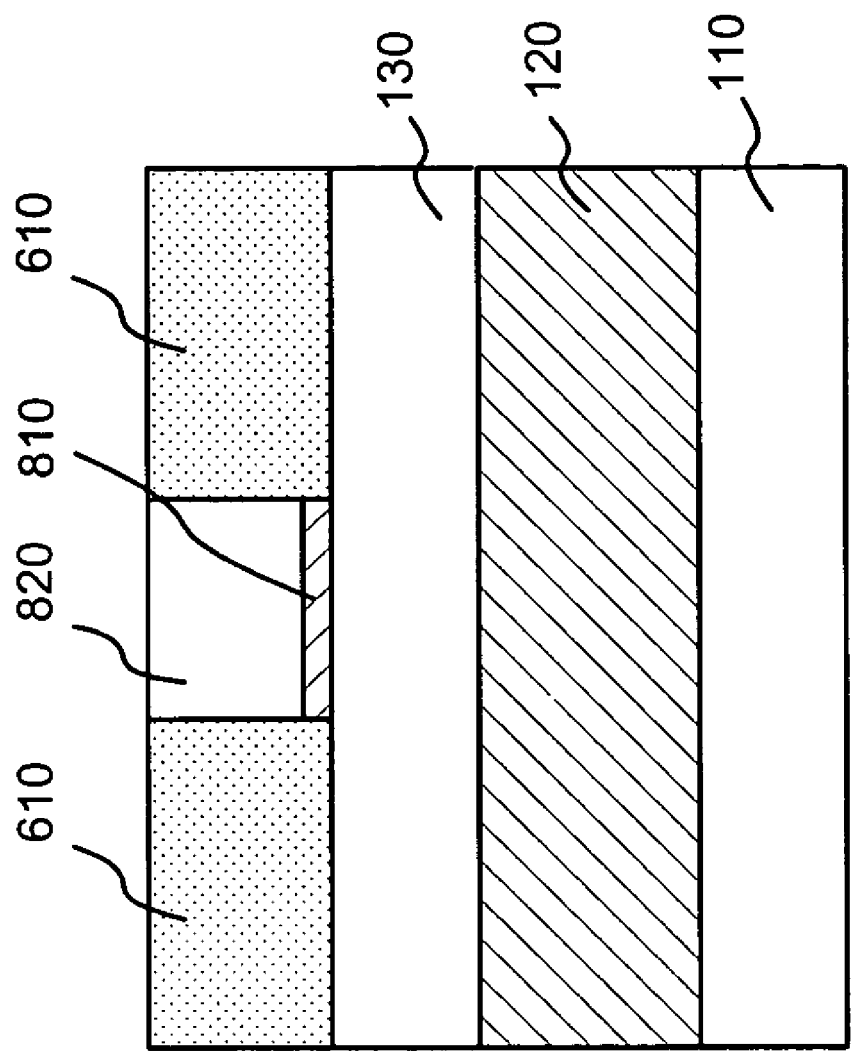

FIG. 8A schematically illustrates the top view of semiconductor device 100 in accordance with an exemplary embodiment of the present invention. The dotted lines in FIG. 8A illustrate the reduced width of thinned silicon fin 130 in the channel region of fin structure 210. FIG. 8B is a cross-section along line A–A' in FIG. 8A further illustrating the formation of the semiconductor device 100. FIG. 8C is a cross-section along line B–B' in FIG. 8A further illustrating the formation of the semiconductor device 100.

A high-k dielectric material 810 such as $HfO_2$ or HfSiO may be formed on fin 130 in the channel region as illustrated in FIG. 8B. Such a high-k dielectric material 810 may have a dielectric constant k higher than about 3.9. In another implementation consistent with the principles of the invention, dielectric material 810 may be an oxide (e.g., $SiO_2$) that is thermally grown on the side surfaces of the thinned silicon fin 130 (and the top surface if dielectric cap 140 has been removed). The dielectric constant k of such $SiO_2$ material may be about 3.9. In either case, the dielectric material 810 may serve as the gate dielectric layer for semiconductor device 100 in the implementation illustrated in FIGS. 8A and 8B.

Next, a metal, such as TaN or TiN may be deposited into the gate-shaped space (which may be referred to as a "gate recess") within surrounding oxide layer 610 that was left by the removal of gate structure 510 (see FIGS. 6B and 7A). This metal may form gate 820, and may be polished (e.g., by CMP) to obtain a relatively planar top surface as shown in FIG. 8C. The surrounding oxide layer 610 around gate 820 may then be removed. FIG. 8A illustrates FinFET device 100 after removal of surrounding oxide layer 610.

Thus, in accordance with the present invention, a FinFET device 100 may be formed with metal gate 820 using a damascene process after thinning silicon fin 130 in a gate recess. The gate recess may be formed by removing dummy gate 510. Advantageously, the resulting structure exhibits good short channel behavior. The metal gate also reduces gate resistance and eliminates poly depletion problems associated with polysilicon gates. In addition, the present invention provides increased flexibility and can be easily integrated into conventional processing.

OTHER IMPLEMENTATION

In some implementations, it may be desirable to achieve automatic stopping at a polysilicon gate after dielectric CMP. FIG. 9A is a cross-section illustrating a FinFET 900 after gate formation (similar to FIG. 5B). A dielectric layer 940 may be formed on a silicon fin 930, an insulator 920, and a substrate 910. A gate material layer (e.g., polysilicon) and SiON (or BARC material) may be deposited on dielectric layer 940 and patterned to form a gate 950 and a stop cap 960, as shown in FIG. 9A. Stop cap 960 may be formed of SiON or the BARC material. The SiON or the BARC material may aid in precisely forming the dimensions of gate 950.

Figure 9C:
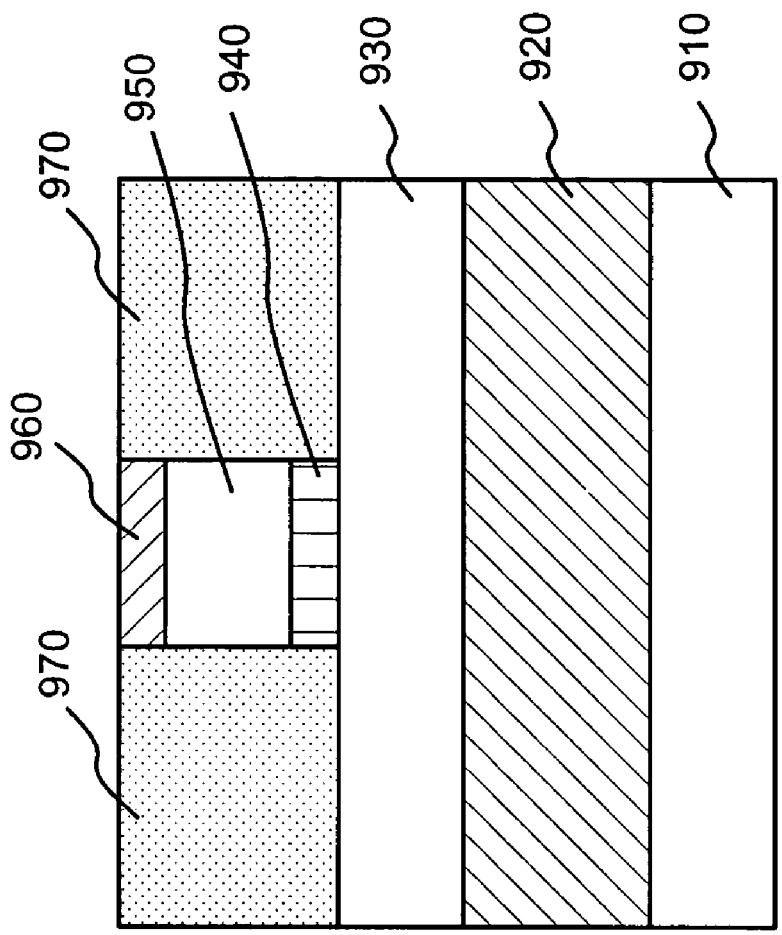

A surrounding dielectric layer 970 may be deposited over dielectric cap 940, gate 950, and stop cap 960 as shown in FIG. 9B. Surrounding dielectric layer 970 may include, for example, TEOS. Surrounding dielectric layer 970 may be polished by CMP using a high selectivity slurry, as shown in FIG. 9C. The presence of stop cap 960 facilitates stopping of such polishing when stop cap 960 is reached. In this manner, stop cap 960 may function as an automatic stop layer during CMP of layer 970. FinFET 900 may continue to be processed in a similar manner as semiconductor device 100. For example, gate 950 may be removed, and a metal gate may be deposited in its place.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A method of manufacturing a semiconductor device, comprising:
    forming a fin structure on an insulator;
    forming a gate structure over a portion of the fin structure, the gate structure comprising a semiconducting material or a metal;
    forming a dielectric layer adjacent the gate structure;
    removing the semiconducting material or the metal in the gate structure;
    reducing a width of a portion of the fin structure; and
    depositing a metal to replace the removed semiconducting material or metal in the gate structure.

2. The method of claim 1, wherein the forming a fin structure includes:
depositing a dielectric layer on a silicon layer, and
etching the dielectric layer and the silicon layer to define the fin structure including a silicon fin and a dielectric cap.

3. The method of claim 2, further comprising:
growing oxide layers on sides of the silicon fin.

4. The method of claim 3, further comprising, after said removing and before said reducing:
removing the oxide layers on sides of the silicon fin.

5. The method of claim 1, wherein the forming a gate structure includes:
depositing a gate material over the fin structure, and
selectively etching the gate material to define the gate structure.

6. The method of claim 1, wherein the forming a dielectric layer includes:
depositing an oxide material over the gate structure, and
polishing the oxide material until a top surface of the oxide material is coplanar with a top surface of the gate structure and the top surface of the gate structure is exposed.

7. The method of claim 1, wherein the removing the semiconducting material or the metal in the gate structure includes:
etching the gate structure to form a gate recess.

8. The method of claim 7, wherein the reducing includes:
reducing the width of the portion of the fin structure below the gate recess.

9. The method of claim 1, wherein the reducing includes:
reducing the width of the portion of the fin structure by about 30 nm to about 80 nm in a channel region of the semiconductor device.

10. The method of claim 1, wherein the reducing includes:
wet etching the portion of the fin structure to reduce the width.

11. The method of claim 1, further comprising:
removing the dielectric layer.

12. A method of manufacturing a semiconductor device, comprising:
forming a fin on an insulator;
forming a gate oxide on sides of the fin;
forming a gate structure over the fin and the gate oxide, the gate structure comprising a semiconducting material;
forming a dielectric layer adjacent the gate structure;
removing the semiconducting material in the gate structure to define a gate recess;
reducing a width of a portion of the fin below the gate recess; and
forming a metal gate in the gate recess.

13. The method of claim 12, further comprising, after said removing and before said reducing:
removing the gate oxide on the sides of the fin.

14. The method of claim 12, wherein the reducing includes: reducing the width of the portion of the fin by about 30 nm to about 80 nm.

15. The method of claim 12, wherein the forming includes:
forming the fin with a width between about 40 nm and about 100 nm.

16. The method of claim 15, wherein the reducing includes:
reducing the width of the portion of the fin to a width between about 10 nm and about 50 nm.

17. The method of claim 12, further comprising, before said forming a metal gate:
forming a gate dielectric on at least the sides of the fin.

18. A method of manufacturing a semiconductor device, comprising:
forming a fin on an insulator;
forming a dielectric cap over the fin;
forming gate oxide layers on opposite sides of the fin;
forming a gate structure over the fin and dielectric cap, the gate structure comprising a semiconducting material or a metal;
forming a dielectric layer adjacent the gate structure;
removing the gate structure to define a gate recess within the dielectric layer and to expose the dielectric cap and gate oxide layers;
removing the gate oxide layers from the opposite sides of the fin to expose the fin from the dielectric cap down to the insulator;
reducing a width of the fin below the gate recess; and
forming a metal gate in the gate recess.

19. The method of claim 18, wherein the reducing includes:
reducing the width of the fin below the gate recess by about 30 nm to about 80 nm.

20. The method of claim 18, wherein the forming a fin includes:
forming the fin with a width between about 40 nm and about 100 nm, and wherein the reducing includes:
reducing the thickness of the fin below the gate recess to a width between about 10 nm and about 50 nm.

* * * * *